United States Patent [19]
Jun

[11] Patent Number: 5,933,101
[45] Date of Patent: Aug. 3, 1999

[54] ANALOG KEYBOARD OF A VIDEO DISPLAY APPLIANCE

[75] Inventor: Il Jin Jun, Kyoungsangbuk-Do, Rep. of Korea

[73] Assignee: LG Electronics, Inc., Seoul, Rep. of Korea

[21] Appl. No.: 08/767,809

[22] Filed: Dec. 17, 1996

[30]  Foreign Application Priority Data

Jan. 15, 1996 [KR]  Rep. of Korea ........................... 96-658

[51] Int. Cl.⁶ ................................................. H01H 19/20
[52] U.S. Cl. .............................. 341/22; 341/35; 345/184; 200/24; 200/28
[58] Field of Search .................................. 341/22, 35, 20, 341/30; 200/28, 24, 564, 570, 5 R, 336; 345/156, 184; 250/231.14

[56]  References Cited

U.S. PATENT DOCUMENTS

| | | | |
|---|---|---|---|
| 4,443,670 | 4/1984 | Nakamura | 200/110 A |
| 4,922,235 | 5/1990 | Pretitjean | 128/653.1 |
| 5,107,088 | 4/1992 | Aoki | 219/719 |
| 5,128,661 | 7/1992 | Fowler | 345/184 |
| 5,229,935 | 7/1993 | Yamagishi | 340/492 |
| 5,541,406 | 7/1996 | Waynik | 250/231.14 |
| 5,593,023 | 1/1997 | Kaizaki | 200/570 |
| 5,613,600 | 3/1997 | Yokoji | 200/564 |

FOREIGN PATENT DOCUMENTS 1288925  11/1969  United Kingdom ........... H03K 17/00

*Primary Examiner*—Michael Horabik
*Assistant Examiner*—Albert K. Wong
*Attorney, Agent, or Firm*—Oppenheim Wolff & Donnelly LLP

[57]  ABSTRACT

An analog keyboard of a video display appliance which serves to minimize the number of control switches of an analog keyboard and enables the diverse design of a monitor in the video display appliance. The analog keyboard includes a plurality of encoding switches having at least two contact terminals for consecutively outputting pulse signals according to the rotation of the encoding switches clockwise or counter-clockwise.

9 Claims, 4 Drawing Sheets

FIG. 3A P1 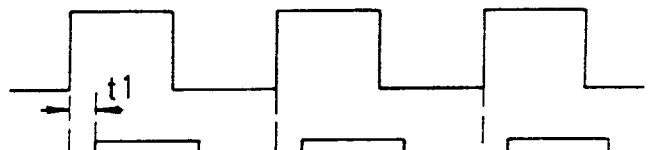
FIG. 3B P2 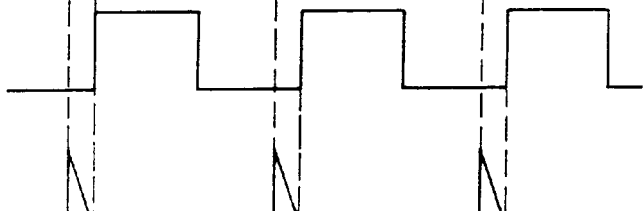
FIG. 3C T1 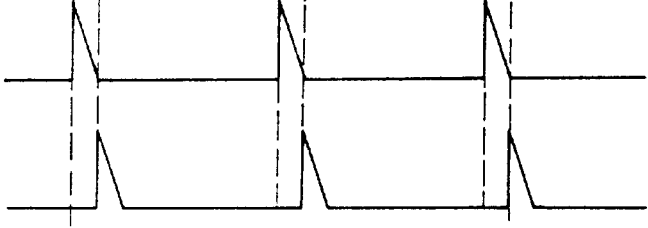
FIG. 3D T2
FIG. 3E Q1 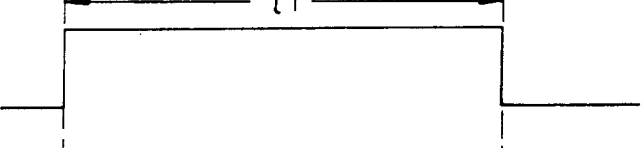
FIG. 3F Q1*
FIG. 3G Q2 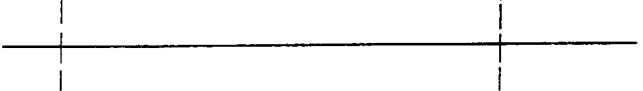
FIG. 3H Q2*
FIG. 3I Vi 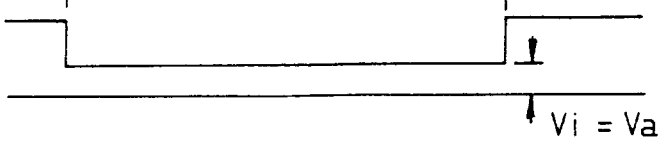

FIG. 4A  P1 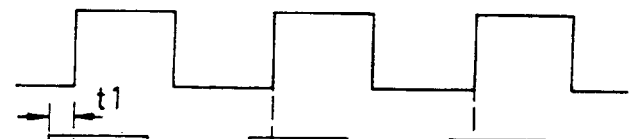
FIG. 4B  P2 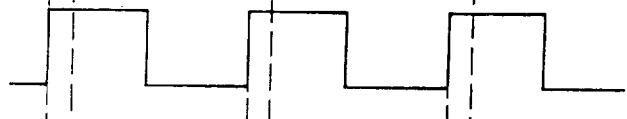
FIG. 4C  T1 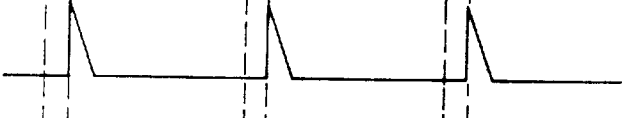
FIG. 4D  T2 
FIG. 4E  Q1 
FIG. 4F  Q1* 
FIG. 4G  Q2 
FIG. 4H  Q2* 
FIG. 4I  Vi 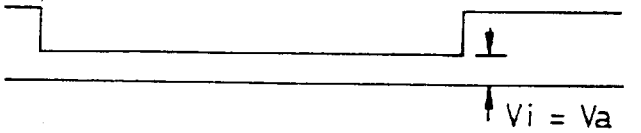

ANALOG KEYBOARD OF A VIDEO DISPLAY APPLIANCE

BACKGROUND OF THE INVENTION

1. Field of the Invention

The present invention relates to an analog keyboard of a video display appliance, particularly to an analog keyboard competent to perform a key input with encoding switches provided in a video display appliance.

2. Description of the Prior Art

Analog keyboards are conventionally positioned on the front lower part of a monitor of a video display appliance, as shown in FIG. 1A. Push-button switches K1 to K8 are used for manipulation of an analog keyboard. Each push-button switch has a screen control function. Thus, the user can control the display state of the picture on the screen by selecting different push-button switches, i.e., an adjustment of the size of the picture, control of the pin cushion raster appearing on the screen, balancing the picture in horizontal and vertical directions. For instance, the user can adjust the left and right balances of the picture by selecting the push-button switch K1 for the adjustment of balancing, and then the push button K7 or K8 for increase or decrease adjustment.

FIG. 1B is a block diagram showing the construction of the conventional analog keyboard. Referring to FIG. 1B, the conventional analog keyboard comprises a plurality of push-button switches K1 to K8 connected in parallel; a plurality of resistors R0 to R8 for dividing the power supply voltage Vcc into voltages corresponding to each push-button switch K1 to K8 connected therebetween; and an analog-to-digital converter 1 for converting the divided power supply voltage Vcc to an analog signal. The analog-to-digital converter 1 may be provided in the microcomputer of the video display appliance.

If the user manipulates a push-button switch, the divided power supply voltage Vcc is applied as an analog signal to the input terminal ADCin of the analog-to-digital converter 1. If the push-button switch K2 is switched on, the input voltage Vi applied to the input terminal ADCin of the analog-to-digital converter 1 can be defined by the following equation.

$$Vi = \frac{Vcc * (R1 + R2)}{R0 + R1 + R2}[V]$$

The analog-to-digital converter 1 converts the voltage Vi to a digital signal. The microcomputer in the video display appliance recognizes this digital value and thus detects the switched state of the push-button switch K2, thereby outputting a control signal for controlling the display state of the picture.

However, each push-button switch employed in the conventional analog keyboard has only a single binary control function corresponding to the on/off state of the switch. Employing a great number of push-button switches to control the display state of the picture is disadvantageous in monitor design, and is liable to cause confusion in selecting appropriate switches.

SUMMARY OF THE INVENTION

The object of the present invention is to solve the aforementioned drawback by providing an analog keyboard of a video display appliance which includes a rotational encoding switch having at least two contact terminals.

To achieve this object, the present invention provides an analog keyboard of a video display appliance having display means, key input means, and control means for controlling the display means according to key signals inputted through the key input means, the analog keyboard comprising:

- at least one encoding switch, having at least two contact terminals, for consecutively outputting a corresponding pulse signal when the at least two contact terminals are consecutively switched at predetermined intervals by at least two moving contacts;
- trigger signal generating means for converting the pulse signal outputted from the encoding switch into a trigger signal;
- switching signal generating means for converting the trigger signal outputted from the trigger signal generating means into a switching signal having a predetermined pulse width; and
- switching means for being switched on or off corresponding to a value of the switching signal outputted from the switching signal generating means and for outputting a resultant value to the control means.

BRIEF DESCRIPTION OF THE DRAWINGS

The above object, other features, and advantages of the present invention will become more apparent by describing the preferred embodiments thereof with reference to the accompanying drawings, in which:

FIGS. 3A to 3I are waveform diagrams explaining the operation of one embodiment of the present invention; and FIGS. 4A to 4I are waveform diagrams explaining the operation of another embodiment of the present invention.

DETAILED DESCRIPTION OF THE PREFERRED EMBODIMENTS

Figure 1A:
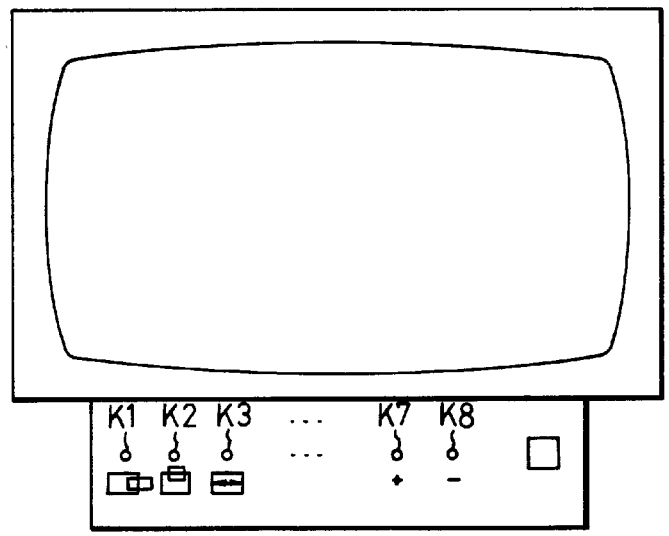
FIG. 1A is a view illustrating an external shape of a conventional monitor.
Figure 1B:
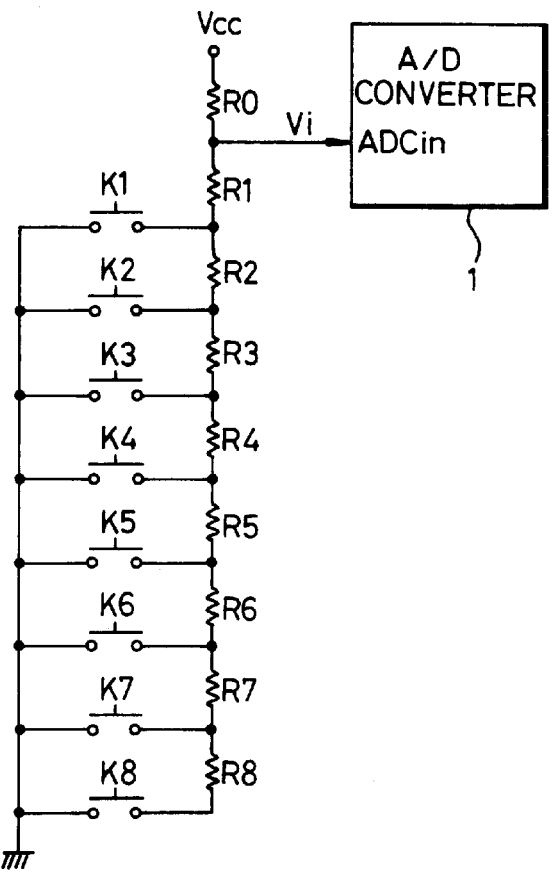
FIG. 1B is a circuit diagram of a conventional analog keyboard.
Figure 2:
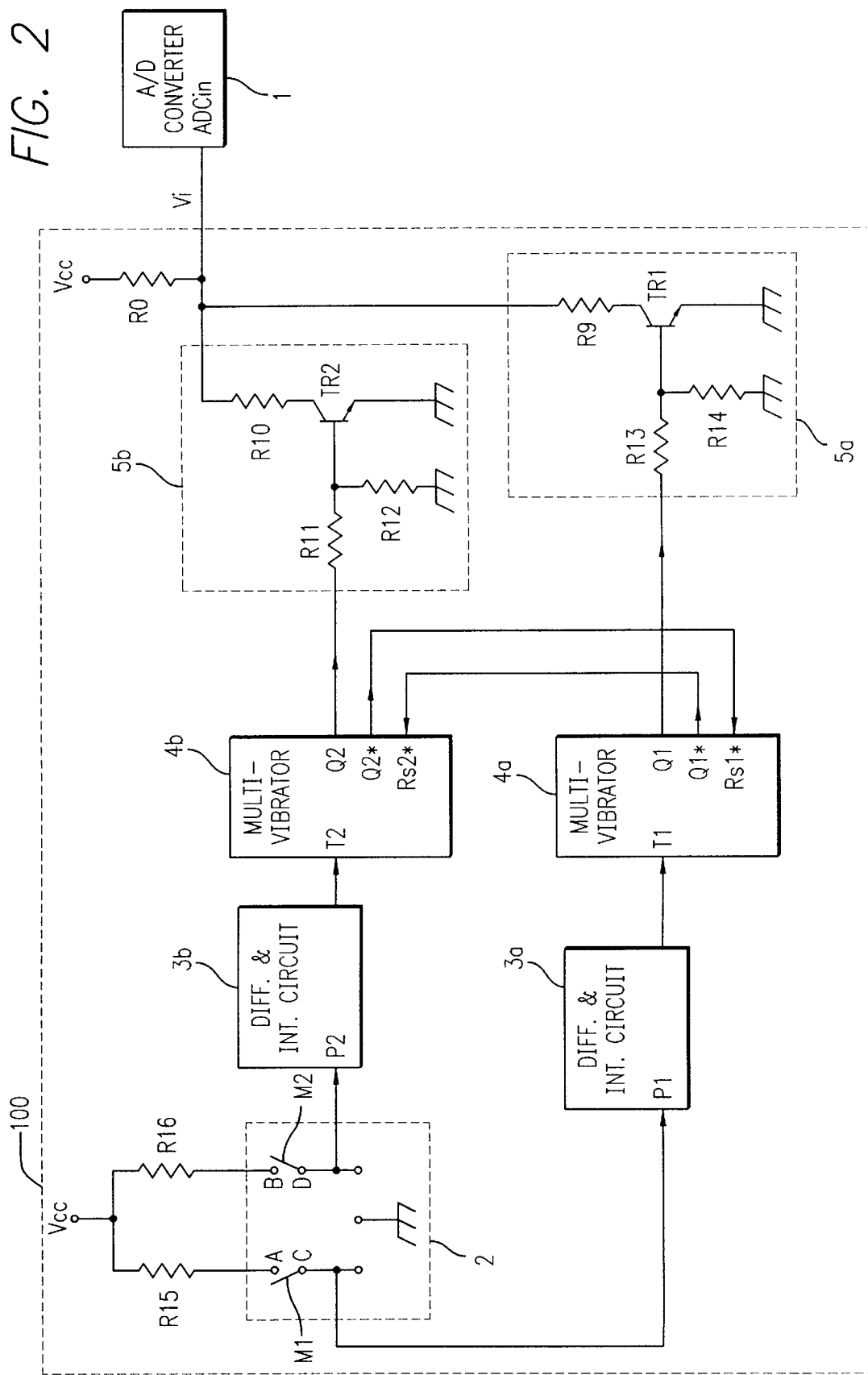
FIG. 2 is a circuit diagram of the analog keyboard having an encoding switch according to the present invention.

Referring to FIG. 2, the analog keyboard according to the present invention includes an encoding switch 2 having two contact terminals A and B and outputting two pulse signals by switching the contact terminals A and B at predetermined intervals, first and second differentiating and integrating circuits 3a and 3b for differentiating and integrating the pulse signals P1 and P2 outputted from the encoding switch 2 to provide a trigger signal, first and second multivibrators 4a and 4b for receiving the trigger signal from the first and second differentiating and integrating circuits 3a and 3b, and outputting a switching signal having a predetermined pulse width, first and second switching sections 5a and 5b for being switched on or off in response to respective outputs of the first and second multivibrators 4a and 4b, and an analog-to-digital converter 1 for converting an input voltage Vi into a digital signal according to the output signals of the switching sections 5a and 5b.

In FIG. 2, the reference numerals R0 to R16, Vcc, TR1 and TR2 respectively, denote resistors, a power supply, and transistors.

Referring to FIG. 2, if the encoding switches in the analog keyboard are to be increased, the entire circuit 100 should be connected in parallel to the input terminal ADCin of the analog-to-digital converter 1. The analog keyboard having the encoding switches constructed as above operates as follows.

Referring FIG. 2, two moving contact M1 and M2 rotate 360° clockwise or counter-clockwise, being in contact with two contact terminals A and B at predetermined intervals. If the moving contacts M1 and M2 come into contact with the contact terminals A and B, two pulse signals having a phase difference from each other are generated. If rotating clockwise, for instance, the moving contacts M1 and M2 come into contact with the contact terminals A and C first, and then with B and D at predetermined intervals, thereby generating two pulses having the phase difference, as shown in Table 1.

If rotating counter-clockwise, the moving contacts M1 and M2 come into contact with the contact terminals B and D first, and then with A and C at predetermined intervals, thereby generating two pulses having the phase difference, as shown in Table 1.

pulse width. It is preferable that the multivibrators comprise a multivibrator circuit which can be retriggered.

If the trigger signal is inputted to the input terminal T1 of the first multivibrator 4a, the first multivibrator 4a outputs a high level signal having a predetermined pulse width τ1 as shown in FIG. 3E through its output terminal Q1, while it outputs a low level signal having a predetermined pulse width as shown in FIG. 3F through its inverting terminal Q1*. The transistor TR1 of the first switching section 5a is turned on by the high level signal as shown in FIG. 3E, while the low level signal as shown in FIG. 3F is inputted to the reset terminal Rs2* of the first multivibrator 4b to reset the first multivibrator 4b.

If the first multivibrator 4a is driven first, the second multivibrator 4b is not triggered, and thus the reset signals as shown in FIGS. 3G and 3H are outputted from the output terminals Q2 and Q2* thereof. If the transistor TR1 is turned on, the input voltage Vi, which is divided by the resistors R0 and R9, is supplied to the analog-to-digital converter 1. In other words, the input voltage, which is expressed by

TABLE 1

| Shaft Rotational Direction | Contact State | Output |
|---|---|---|
| Clockwise Direction | A–C | ON/OFF pulse |
|  | B–D | ON/OFF pulse |
| Counter-Clockwise Direction | A–C | ON/OFF pulse |
|  | B–D | ON/OFF pulse |

Accordingly, if the moving contacts M1 and M2 in FIG. 2 rotate clockwise, a pulse signal P1 is inputted to the first differentiating and integrating circuit 3a first, as illustrated in FIG. 3A, and then a pulse signal P2 is inputted to the second differentiating and integrating circuit 3b later with a time difference t1, as illustrated in FIG. 3B.

In this case, the first differentiating and integrating circuit 3a differentiates and integrates the input pulse signal P1 to eliminate noise, and then outputs a trigger signal to the input terminal T1 of the first multivibrator 4a, as shown in FIG. 3C. The second differentiating and integrating circuit 3b also differentiates and integrates the input pulse signal P2 to eliminate noise, and then outputs a trigger signal as shown in FIG. 3D to the input terminal T2 of the second multivibrator 4b.

Two multivibrators 4a and 4b are triggered by the trigger signal to output a switching signal having a predetermined $Vi = Vcc \times R9/(R0+R9) = Va$ [V], is supplied to the input terminal ADCin of the analog-to-digital converter 1 provided in the microcomputer of the video display appliance, as shown in FIG. 3I.

Accordingly, the analog-to-digital converter 1 converts the input voltage Va to a digital value to apply the converted value to the microcomputer. The microcomputer subsequently determines the voltage level and recognizes that the moving contacts M1 and M2 of the encoding switch 2 rotated clockwise.

The microcomputer in the video display appliance supplies the control signal corresponding to the output signal of the analog-to-digital converter 1 to the monitor of the video display appliance, thereby enabling control of the established functions such as an adjustment of the picture size, control of the pin cushion raster on the screen, or balancing of the picture.

By contrast, if the moving contacts M1 and M2 of the encoding switch 2 rotate counter-clockwise, the pulse signal P2 is inputted first to the second differentiating and integrating circuit 3b as shown in FIG. 4B, and the pulse signal P1 is later inputted to the first differentiating and integrating circuit 3a with a predetermined interval t1, as shown in FIG. 4A.

In this case, the second differentiating and integrating circuit 3b differentiates and integrates the input pulse signal P2 to eliminate noise, and then outputs a trigger signal as shown in FIG. 4D to the input terminal T2 of the second multivibrator 4B. The first differentiating and integrating circuit 3a differentiates and integrates the pulse signal P1 to eliminate noise, and then outputs a trigger signal as shown in FIG. 4C to the input terminal T1 of the first multivibrator 4a. Two multivibrators 4a and 4b are triggered by the trigger signals to output a switching signal having a predetermined pulse width. The trigger signal is inputted to the input terminal T2 of the second multivibrator 4b first to output a high level signal having a predetermined pulse width τ1 as shown in FIG. 4G through its output terminal Q2, and a low level signal having a predetermined pulse width as shown in FIG. 4H through its inverting terminal Q2*.

The transistor TR2 of the second switching section 5b is turned on by the high level signal as shown in FIG. 4G, while the low level signal as shown in FIG. 4H is inputted to the reset terminal Rs1* of the second multivibrator 4a to reset the second multivibrator 4a. Accordingly, the first multivibrator 4a is not triggered if the second multivibrator 4b is driven first. Thus, the reset signals as shown in FIGS. 4E and 4F are outputted from the output terminals Q1 and Q1* thereof. If the transistor TR2 is turned on, the input voltage Vi divided by the resistors R0 and R10 is supplied to the analog-to-digital converter 1.

In other words, the input voltage, which is expressed by Vi=Vcc×R10/(R0+R10)=Vb [V], is supplied with a predetermined voltage level Vb as shown in FIG. 4I to the input terminal ADCin of the analog-to-digital converter 1. The analog-to-digital converter 1 converts the input voltage Vb into a digital value, and thus the microcomputer determines the converted value and recognizes that the moving contacts M1 and M2 rotated counter-clockwise.

Conventional push-button switches are also available if connected in parallel to the input terminal of the analog-to-digital converter 1.

According to the present invention as described above, an analog keyboard is provided with encoding switches having at least two contact terminals. Employment of a single encoding switch serves to reduce the number of conventional control switches by half by performing more than one control command for controlling the picture state. Employment of an encoding switch having at least two contact terminals further serves to reduce the number of control switches. It thereby enables the design of diverse types of a monitor for a video display appliance requiring a number of analog keyboard switches.

What is claimed is:

1. An analog keyboard of a video display appliance having display means, key input means, and control means for controlling the display means according to key signals inputted through the key input means, the analog keyboard comprising:

at least one encoding switch, having two stationary contact terminals and two moving contacts for consecutively outputting corresponding first and second pulse signals when the two contact terminals are consecutively switched at predetermined intervals by the two moving contacts;

first and second trigger signal generating means for converting the pulse signals outputted from the encoding switch into first and second trigger signals respectively;

first and second switching signal generating means for converting the trigger signals outputted from the first and second trigger signal generating means into first and second switching signals respectively, each switching signal having a respective predetermined pulse width; and first and second switching means for being switched on or off corresponding to the switching signals outputted from the first and second switching signal generating means respectively, and for outputting corresponding resultant values to the control means.

2. An analog keyboard as claimed in claim 1, wherein the first and second signal generating means each comprises a differentiating and integrating circuit.

3. An analog keyboard as claimed in claim 1, wherein the first and second signal switching signal generating means each comprises a multivibrator circuit.

4. An analog keyboard as claimed in claim 1, wherein the first and second switching means each comprises a switching circuit having a switching transistor.

5. An analog keyboard of a video display appliance having a display responsive to control signals received from the analog keyboard, the analog keyboard comprising:

an encoding switch having contacts for generating pulses having a first phase difference if the switch is rotated in a first direction and a second phase difference if the switch is rotated in a second direction opposite from the first direction;

detection circuitry operatively connected to the encoding switch for detecting whether pulses were generated having said first phase difference or said second phase difference;

first and second voltage dividers responsive to said detection circuitry for generating first and second voltages depending on whether said switch was rotated in said first direction or said second direction, respectively; and control means responsive to the voltage dividers for controlling the display in response to movement of the encoding switch.

6. An apparatus as in claim 5 wherein:

said encoding switch has first and second outputs;

and wherein said first and second phase differences are defined according to on which of said first and second encoding switch outputs a pulse was first generated.

7. An apparatus as in claim 5, wherein said detection circuitry comprises:

first and second differentiating and integrating circuits; and first and second pulse generators.

8. An apparatus as in claim 7 wherein:

said first and second pulse generators are operatively interconnected such that when one of said pulse generators generates a pulse, the other pulse generator is inhibited from generating a pulse.

9. An apparatus as in claim 5 wherein:

said voltage dividers are connected in parallel to a single input of said control means.

* * * * *